United States Patent [19]
Macbeth et al.

[11] Patent Number: 5,608,345
[45] Date of Patent: Mar. 4, 1997

[54] PROGRAMMABLE SWITCHED CAPACITOR CIRCUIT

[75] Inventors: Ian C. Macbeth; Douglas M. Pattullo, both of Holmes Chapel, United Kingdom

[73] Assignee: Pilkington Micro-Electronics Limited, United Kingdom

[21] Appl. No.: 194,528

[22] Filed: Feb. 10, 1994

[30] Foreign Application Priority Data

Feb. 12, 1993 [GB] United Kingdom ................ 9302881

[51] Int. Cl.⁶ .................................................... H03H 11/12
[52] U.S. Cl. ...................... 327/337; 327/554; 327/561
[58] Field of Search .................................. 327/552, 553, 327/554, 555, 557, 558, 559, 561, 563, 337; 333/173

[56] References Cited

U.S. PATENT DOCUMENTS

| | | | |
|---|---|---|---|
| 4,313,096 | 1/1982 | Fleischer | 327/554 |
| 4,378,538 | 3/1983 | Gignoux | 327/554 |
| 4,504,803 | 3/1985 | Lee et al. | 332/31 R |
| 4,507,625 | 3/1985 | Lee et al. | 332/31 R |
| 4,607,231 | 8/1986 | Nakayama | 330/51 |
| 4,769,612 | 9/1988 | Tamakoshi et al. | 327/554 |
| 4,835,482 | 5/1989 | Tamakoshi et al. | 327/554 |
| 4,849,662 | 7/1989 | Holberg et al. | 327/554 |
| 4,924,189 | 5/1990 | Seen et al. | 327/554 |

FOREIGN PATENT DOCUMENTS

0450863 10/1991 European Pat. Off. .
WO82/03955 11/1982 WIPO .

OTHER PUBLICATIONS

"Microprocessor Programmable Universal Active Filters," (Maxim Integrated Products Inc.), *Elektor Electronics,* vol. 17, No. 195, Dec. 1991, Canterbury, GB, pp. 64–69.
Lee et al., "Exact Synthesis of N-path Switched Capacitor Filters".
Herbst et al., "VIS-SC-Filters with reduced influences of parasitic capacitamces", Apr. 1982, pp. 29–39, IEE Proe., vol. 129, pt. G, No. 2.

*Primary Examiner*—Timothy P. Callahan
*Assistant Examiner*—My-Trang Nv Ton
*Attorney, Agent, or Firm*—Burns, Doane, Swecker & Mathis

[57] ABSTRACT

A switched capacitor circuit is described which is programmable so that its function can be set by a user. Thus, control circuitry and selection circuitry are provided to enable one of a plurality of alternative control signals to be provided to switch circuits of the switched capacitor circuit. In this way, the function of the switched capacitor circuits can be altered. Where there are a plurality of switched capacitor circuits connected in an array, the topology of the array can be altered by suitably routing particular input signals to particular outputs by selecting the control signals to control the switched circuits. A field programmable array of this type is also described.

32 Claims, 11 Drawing Sheets

CLOCKS:

PROGRAMMABLE SWITCHED CAPACITOR CIRCUIT

FIELD OF THE INVENTION

The present invention relates to a programmable switched capacitor circuit, and particularly but not exclusively to a programmable analogue cell incorporating a switched capacitor circuit, and to an array of such cells.

BACKGROUND OF THE INVENTION

Switched capacitor circuits are known and have been used in filter circuits to emulate the behaviour of a resistor by switching charge into and out of a capacitor through switch circuits on either side of the capacitor. They have been used particularly in filter circuits to implement the resistive part of a R-C timing circuit for a filter. That is, the switched capacitor circuit is used to charge up a second capacitor at a particular rate, the rate of charge of the second capacitor depending on the ratio of values between the switched capacitor and the second capacitor. A known switched capacitor circuit comprises a capacitor (the "switched" capacitor) connected between first and second switch circuits. Each switch circuit has two terminals in addition to a terminal connecting it to the switched capacitor. The switch circuit connected to a first terminal of the switched capacitor has a terminal connected to an input voltage for the switched capacitor circuit and a terminal connected to ground. The switch circuit connected to a second terminal of the switched capacitor has a terminal connected to an output of the switched capacitor circuit and a terminal connected to ground. The switch circuits can be controlled by non-overlapping clock signals which cause the switches to toggle between the two terminals. This toggling effect causes charge packets to be transferred into and then out of the capacitor to emulate the behaviour of a resistor.

Subsequent developments have led to the use of switched capacitor circuits in many different structures over and above the emulation of resistor behaviour. These structures behave in a definable manner even though some do not have any continuous time equivalent.

In existing switched capacitor circuits, the required non-overlapping clock signals are supplied to all of the switch circuits in the circuit. This is done by a hard wired bus extending from a clock signal generator to each of the switch circuits. Thus, the switch circuits are committed at the time that the chip is made since at this time the hard wired distribution of the bus is determined.

In some existing circuits the possibility exists to externally program or control the value of components so that the tuning of the circuit can be adjusted. These circuits include programmable switched capacitor filters, tunable transconductor-C circuits and analogue neural networks where synapse weights are adjusted by setting component values. However, all of the known circuits are restricted in being able to implement only a fixed topology and function.

In one aspect, the present invention seeks to provide a switched capacitor circuit which is programmable so that its function can be set by a user.

In another aspect, the present invention seeks to provide a switched capacitor circuit which is field programmable or reprogrammable whereby both the functions of the circuit and the tuning of its response can be set by a user with the circuit in situ.

SUMMARY OF THE INVENTION

According to one aspect of the present invention there is provided a switched capacitor circuit comprising a capacitor connected in circuitry which includes first and second switch circuits on opposite sides of said capacitor and control circuitry operatively connected to at least one of said first and second switch circuits, said control circuitry being operable to provide one of a plurality of alternative control signals for controlling operation of said at least one switch circuit, one of said alternative control signals being a periodically varying signal to alternate the state of the switch circuit between two alternative states and another of said alternative control signals causing the switch circuit to be held in a fixed state, and selection circuitry to select one of said alternative control signals, said selection circuitry being programmable so that the selection between the alternative control signals can be determined by a user.

The invention thus provides a switched capacitor circuit which can effectively be configured to perform any of a wide variety of standard switched capacitor functions by providing selectively control signals for determining the mode of operation of the switch circuits. The selection of control signals can be specified according to a plurality of program selections, selected for example according to digital data which may be supplied from elsewhere or stored in digital storage means (e.g. RAM), and optionally may additionally be selected according to one or a number of dynamic signal inputs.

In a preferred embodiment of the present invention, the capacitor is programmable to vary the capacitance in circuit between the first and second switch circuits. This enables the component value of the circuit to be adjusted.

Such a switched capacitor circuit provides a basic circuit for a system in which not only component values but also circuit topology and functions can be programmed in situ. This can be achieved without loss in performance when compared with standard fixed topology counterparts.

In the present context, the topology of a circuit is a reference to the connections within the circuit and in particular includes the routing of particular input signals to particular outputs by suitably selecting the control signals to control the switch circuits to provide programmed fixed connections. The function of the circuit is a reference to the way in which it modifies a signal as it passes through the circuit. As is known, a switched capacitor circuit can implement specific functions which emulate the behaviour of a series resistor of positive or negative value, or which can implement a series capacitor.

To implement these functions, the first and second switch circuits are each simple toggle switches having a terminal connected one to each pole of the capacitor and having a switch element connected to that terminal and capable of toggling between a voltage and ground. Other switch circuits are envisaged for use in the present invention in any arrangement which enables a switched capacitor function to be implemented.

For example the first switch circuit on the input side of the capacitor can be a toggle switch, and the second switch circuit can be provided by any circuitry establishing a low impedance node capable of receiving charge samples, for example a virtual ground established at an input terminal of an operational amplifier.

The present invention is applicable to provide inter alia programmable switched-capacitor filters, integrators, differentiators, gain stages, adders/subtractors, sample-and-hold, rectifiers, oscillators.

The control circuitry can be arranged to provide said alternative control signals from a number of signals input to it, the selection circuitry being arranged to select between the input signals. Alternatively, the control circuitry can be arranged to generate different control signals under the control of the selection circuitry.

According to another aspect of the present invention there is provided an array of programmable cells each comprising a switched capacitor circuit connected to an active element, each switched capacitor circuit comprising a capacitor connected in circuitry which includes first and second switch circuits connected on opposite sides of said capacitor the array including control circuitry operatively connected to each of said first and second switch circuits, said control circuitry being operable to provide one of a plurality of alternative control signals for controlling operation of said switch circuits, one of said alternative control signals being a periodically varying signal to alternate the state of the switch circuits between two alternative states and another of said alternative control signals causing the switch circuit to be held in a fixed state, and selection circuitry to select one of said alternative control signals.

The control circuitry can be common to all cells in the array or can be provided for each cell in the array.

A further aspect of the present invention provides a method of operating a switched capacitor circuit comprising a capacitor connected in circuitry including first and second switch circuits on opposite sides of said capacitor which method comprises selecting one of a plurality of control signals for determining the state of said first and second switch circuits, said control signals including at least one periodically varying signal and at least one signal for holding the switch circuit in a fixed state.

According to another aspect of the present invention there is provided an array of programmable analogue cells each comprising a plurality of switched capacitor circuits, each comprising a capacitor connected between first and second switch circuits, said switched capacitor circuit being selectively connectable to an active element of said cells, wherein the array includes control circuitry operatively connected to each of the switch circuits, said control circuitry being operable to provide at least two alternative control signals controlling operation of said switch circuits, at least one of said control signals being a periodically varying signal to alternate the state of at least one of the switch circuits between two alternative states, and selection circuitry to select one of said alternative control signals, whereby each switch circuit in the cell is controlled to configure the cell to have a particular topology and function.

In one embodiment, the active element is an operational amplifier having an inverting input, a non-inverting input connected to ground and an output with a capacitor connected in feedback between the output of the operational amplifier and the inverting input wherein said plurality of switched capacitor circuits are connected between respective inputs to the cell and the inverting input of the operational amplifier.

The invention also provides a programmable analogue cell comprising an active element such as an operational amplifier having an inverting input, a non-inverting input and an output;

a capacitor connected in feedback between the output of the active element and the inverting input; and a plurality of switched capacitor circuits connected between respective inputs to the cell and the inverting input of the active element each switched capacitor circuit comprising a capacitor connected between first and second switch circuits, wherein each cell has connections for operative connection to control circuitry, said control circuitry being operable to provide one of at least two alternative control signals for controlling operation of said switch circuits at least one of said alternative control signals being a periodically varying signal and selection circuitry to select one of said alternative control signals.

It will be understood that the term "periodically varying" is used herein in its sense as normally understood by a person in this field to represent a signal which has a repeated pattern with a definable period. This includes, but is not restricted to, square wave clock signals.

For a better understanding of the present invention and to show how the same may be carried into effect reference will now be made by way of example to the accompanying drawings.

DESCRIPTION OF THE PREFERRED EMBODIMENT

Figure 1:
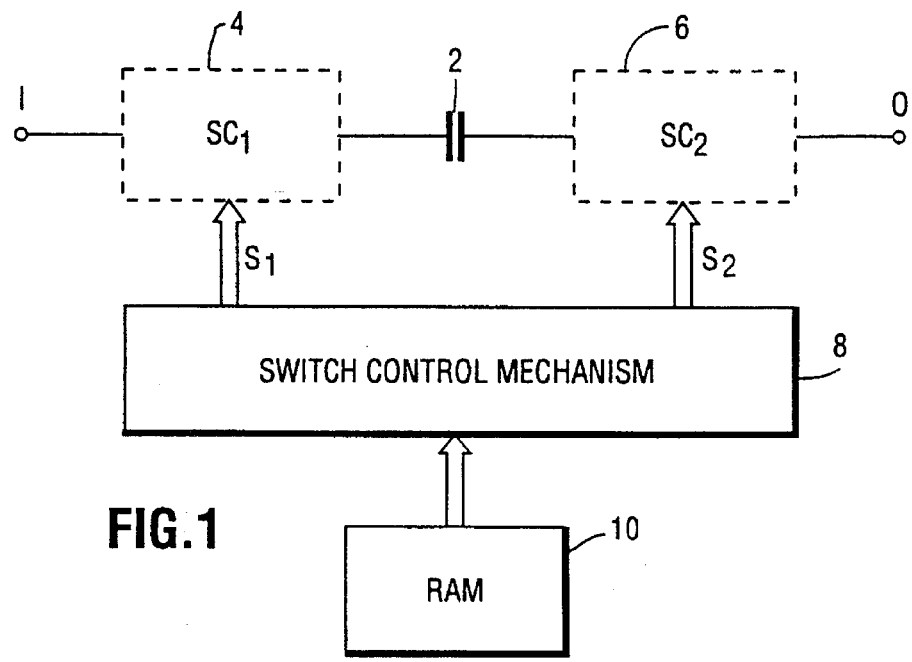
FIGS. 1 and 1a are block diagrams of switched capacitor circuits illustrating the general principles of the present invention.
Figure 1A:
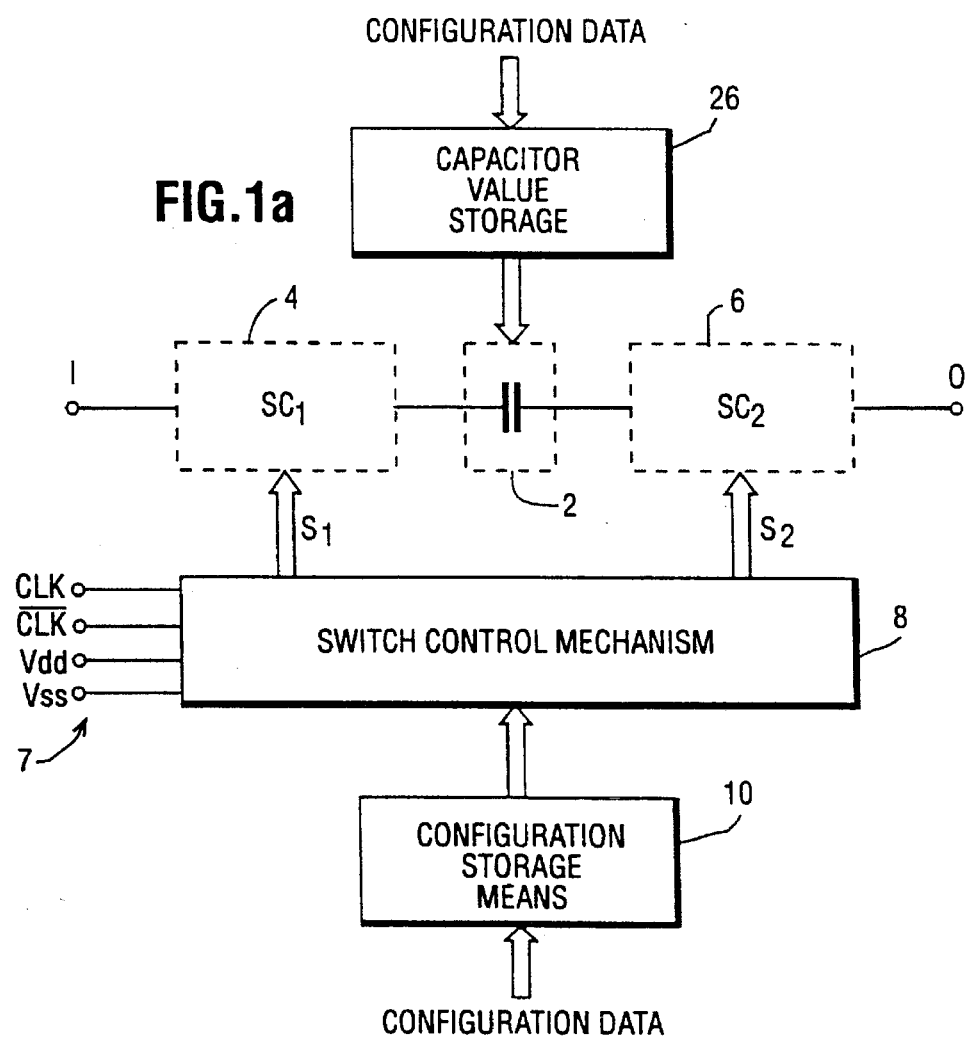

FIG. 1 is a block diagram illustrating the principles of a switched capacitor circuit in accordance with one embodiment of the present invention. The switched capacitor circuit comprises a capacitor 2 which is connected between first and second switch circuits 4,6. The switch circuits 4,6 are controlled by control signals S which are denoted diagrammatically by the arrows S1,S2 in FIG. 1. The control signals S1,S2 are provided by a switch control mechanism 8 including control circuitry which provides a set of alternative control signals and selection circuitry which selects between the alternative signals. The first switch circuit 4 is connected between an input I and a first terminal of the capacitor 2 while the second switch circuit 6 is connected between a second terminal of the capacitor 2 and an output O. In FIGS. 1 and 1a, the detonation SC1 denotes a switch circuit connected to the first terminal of the capacitor and SC2 will denote a switch circuit connected to the second terminal of the capacitor. The switch control mechanism 8 enables selected ones of a set of alternative control signals to be supplied to control the switch circuits 4,6. FIG. 1 also illustrates a storage device in the form of a RAM 10 which is provided to store a control program which controls the manner in which the switch control mechanism 8 produces the control signals S1,S2 for controlling the switch circuits 4,6.

Figure 1B:
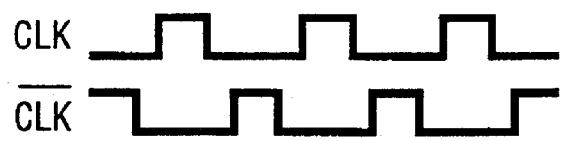
FIG. 1b illustrates two overlapping clock signals used for controlling the switch circuits.

The provision of control signals and selection therebetween can be done in a variety of ways. FIG. 1a illustrates a circuit similar to that of FIG. 2 wherein the switch control mechanism has control circuitry in the form of a plurality of terminals 7 for receiving signals available elsewhere in the circuit, namely CLK,$\overline{CLK}$,Vdd and Vss. $\overline{CLK}$ and CLK are non-overlapping clock signals as illustrated in FIG. 1b. Vdd represents the positive supply rail and Vss represents the negative supply rail. The switch control mechanism includes selection circuitry suitable for selecting specified ones of these signals to control the switch circuits SC1 and SC2. A further improvement to the basic circuit is to provide as the capacitor 2 in the switched capacitor circuit a so-called programmable capacitor the capacitance value of which can be varied in response to digital codes stored, for example, in a Random Access Memory RAM as indicated by reference numeral 26. A dynamic reset signal 29 can be provided for overwriting the digital codes stored in the RAM 26 to reset the value of capacitance of the capacitor 2.

Figure 2:
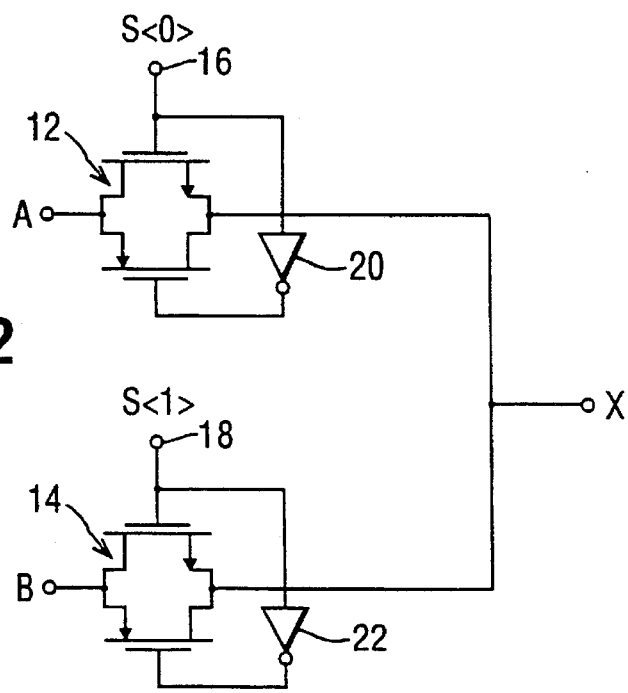
FIG. 2 is a circuit diagram illustrating one implementation of a switch circuit of FIG. 1.

FIG. 2 is a circuit diagram of one possible implementation for each switch circuit 4,6. Thus, each switch circuit comprises first and second terminals A,B each of which are connected to respective pass gates 12,14. Each pass gate is formed from a pair of complementary MOS transistors in a known manner. Each pass gate has connected between its control terminal 16,18 and facing terminal an inverter, referenced 20 for the first gate and 22 for the second gate. The outputs of each pass gate 12,14 are coupled to a common output terminal X. Each pass gate has a control terminal 16,18 respectively to which are supplied control signals from the switch control mechanism 8. In FIG. 2, the control terminal 16 of the first pass gate 12 receives the control signal S<0> while the control terminal 18 of the second pass gate 14 receives the control signal S<1>. The denotation S<0>,S<1> denotes the bit lines of the bus used to transmit the control signal S. Thus, each switch circuit will receive two control signals on adjacent bit positions of the bus, and operates according to these control signals as explained below.

The connection of the capacitor 2 between first and second switch circuits 4,6 each of the type illustrated in FIG. 2 is a known so-called parasitic insensitive switched capacitor connection arrangement where the function of the switched capacitor circuit is unaffected by unwanted parasitic capacitance to ground that will inevitably arise in a physical implementation.

Table I shows the various modes of operation of the switch circuits 4,6 by associating with each switch representation a particular programming function. The switch representations as illustrated in Table I are used in the accompanying figures to illustrate the mode of operation of a switch circuit.

In the first mode, the connection X-A is permanently closed while the connection X-B is permanently open. In the second mode the connection X-B is permanently closed while the connection X-A is permanently open. In the third mode the connections are toggled such that X-A is closed only when CLK is high and X-B is closed only when $\overline{CLK}$ is high., i.e. CLK is connected as S<0> and $\overline{CLK}$ is connected as S<1>. In the fourth mode the connections are toggled such that X-A is closed only when $\overline{CLK}$ is high and X-B is closed only when CLK is high, i.e. $\overline{CLK}$ is connected as S<0> and CLK is connected as S<1>. In the fifth mode the connections X-A and X-B are permanently open-circuit. The sixth mode is a general external function mode in which the connections X-A and X-B are determined by a special purpose control function. The seventh diagram indicates the general symbol used herein for a programmable switch mode in which the switch is a toggle switch with an uncommitted function, controllable in response to control signals from the switch control mechanism.

It will be appreciated that as is well known in the operation of a switched capacitor circuit the connections X-A and X-B must never be closed simultaneously. This provision must also be adhered to when external function control is applied in the sixth mode.

Figure 3A:
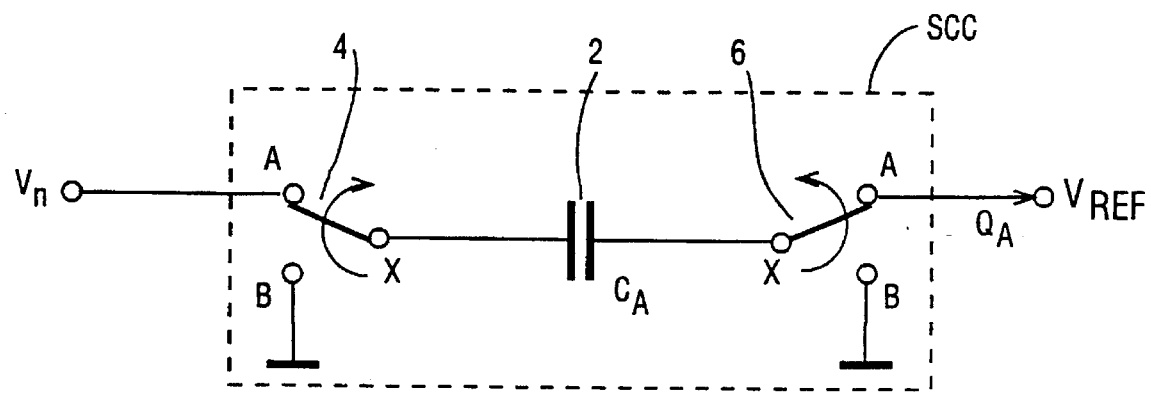
FIGS. 3a to 3c are illustrations of three different functions which a switched capacitor circuit can implement.
Figure 3B:
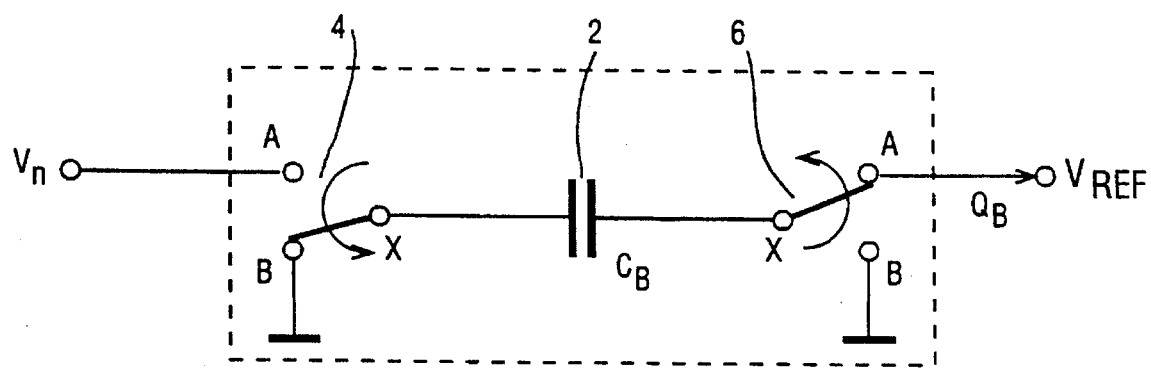
Figure 3C:
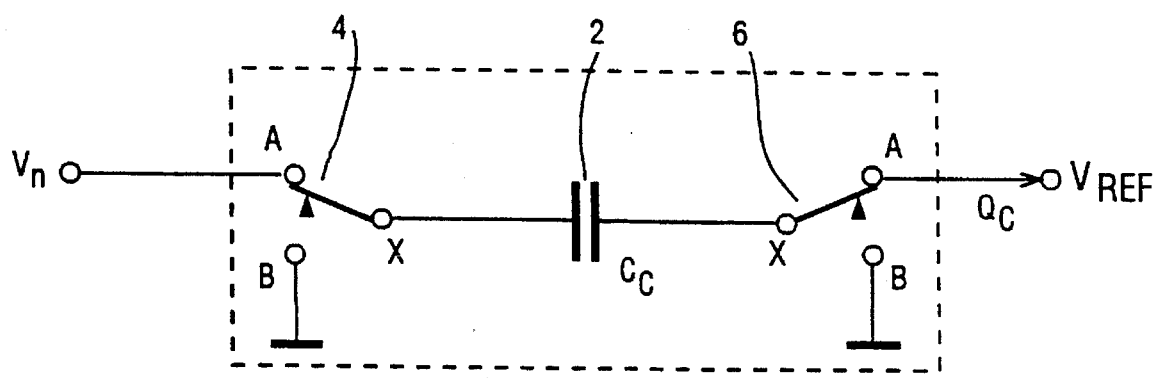

FIG. 3a to 3c illustrate three different functions of a switched capacitor circuit.

FIG. 3a illustrates a switched capacitor circuit which is used to provide a function emulating a resistance between the input I and the output 0. The dotted line indicated with reference numeral 1 is drawn around a switched capacitor circuit which comprises a capacitor 2 and first and second switch circuits 4,6. In the following text, a switched capacitor circuit will be referred to generally as SCC when appropriate. Each of the first and second switch circuits 4,6 is in the third mode of operation where in the first switch circuit 4 the first terminal A is connected to receive a voltage Vn at the input I and the second terminal B is connected to ground. In the second switch circuit 6, the terminal A is connected to an output reference voltage Vref and the terminal B is connected to ground.

In FIG. 3b the terminals A and B of the first and second switches 4,6 are connected as in FIG. 3a but the first switch 4 is in the fourth mode of operation while the second switch 6 is in the third mode of operation. With this arrangement, the switched capacitor circuit 1 implements a function emulating a so-called negative resistance between the input I and the output O.

In FIG. 3c, the terminals A and B of the second switches are connected as shown in FIG. 3b and both of the switches are set in the first mode. Thus, the capacitor 2 is connected directly between the input and the output and thus behaves as a capacitor. This is shown in FIG. 3c.

Table II denotes the quantity of charges which are transferred between the input I and the output O in each implementation. The letters $Q_A, Q_B$ and $Q_C$ refer to the quantities of charge transferred in each of FIGS. 3a to 3c respectively while the letters $C_A, C_B$ and $C_C$ denote the value of the capacitance of the capacitor 2 in each of the implementations of FIGS. 3a to 3c respectively.

Table II illustrates the quantity of charge transferred in each case evaluated in the z domain, that is as a function of the unit cycle time of the clock signals (CLK,$\overline{CLK}$) controlling the switches. This type of analysis is the usual way of considering charge transfer in switched capacitor circuits. On the right hand side of Table II, values are given for the case when Vref is at virtual ground. As will be described later, a virtual ground can be provided at the feedback input of an operational amplifier.

Figure 4:
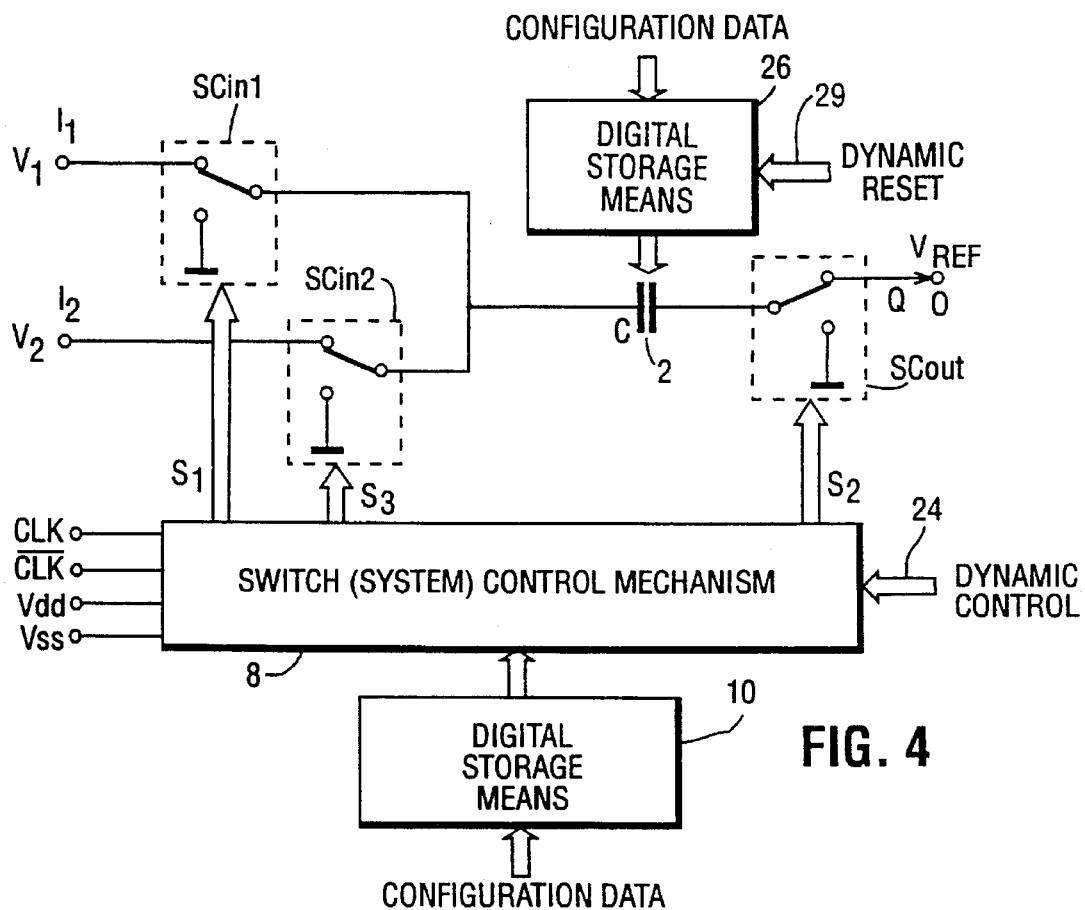
FIG. 4 is a block diagram of an improved switched capacitor circuit.

In each of FIGS. 3a to 3c the input terminal I for the switch capacitor circuit 1 is shown connected to a single input voltage Vn. FIG. 4 shows how the voltage Vn can be effectively selected from two input voltages V1,V2. Each voltage V1,V2 is supplied to the input terminal I1, I2 of a respective first switch circuit SCin1,SCin2. The outputs of the switch circuits SCin1,2 are both connected to the first terminal of the capacitor 2. The second terminal of the capacitor 2 is connected to a second switch circuit SCout as already described. SCout in FIG. 4 corresponds to SC2 in FIGS. 1 and 1a.

The switch control mechanism 8 provides control signals S1,S2 as referred to above in FIG. 1 and a further control signal S3, the control signals S1,S3 controlling the respective first switch circuits SCin1,2 and the control signal S2 controlling the second switch circuit SCout. In FIG. 4, the switch control mechanism 8 receives input signals CLK, $\overline{CLK}$,Vss and Vdd and selects appropriate ones of the input signals to be applied as control signals S1,S2 and S3 to the switch circuits SCin1,2,SCout. Thus both of the switched capacitor circuit function and the selection of input voltage (topology) can be controlled. Thus, it is possible, for example, to apply the clock signals CLK,$\overline{CLK}$ to the first switch circuit SCin1 so that that switch circuit toggles between the input voltage V1 and ground and to apply a control signal S3 to the switch circuit SCin2 which disconnects the capacitor from the input voltage V2. The control signal S2 can apply to the switch circuit SCout the clock signals CLK,$\overline{CLK}$ so that that switch circuit also toggles between the output Vref and ground. In that case, a switched capacitor circuit with a function emulating a resistance is connected between V1 and Vref (as in FIG. 3a). It will be appreciated that many other combinations and variations are possible with the circuit of FIG. 4 since it provides versatility not only over the mode of operation of the switched capacitor circuit but also over the input voltage supplied to that circuit.

The supply of the control signals S1,S2,S3 by the switch control mechanism 8 can be controlled by programming bits stored in the RAM 10. The programming of the RAM can be done in accordance with configuration data supplied to it. This configuration data can define selection programs for storage in the RAM 10. A selection program can include a programming bit or bits indicating that the supply of the control signals S1,S2,S3 from the switch control mechanism should be carried out under the control of a dynamic control signal 24 originating from external circuitry or from within the implemented circuit. With use of this dynamic control, the function of the switched capacitor circuit can be varied in response to events. An additional capability of the dynamic control facility would be to provide switch control signals derived directly from the dynamic control signals which could be applied to the switch circuits using the control lines S1,2,3 in place of the clock signals CLK, $\overline{CLK}$ provided to the switch control mechanism 8.

Figure 5:
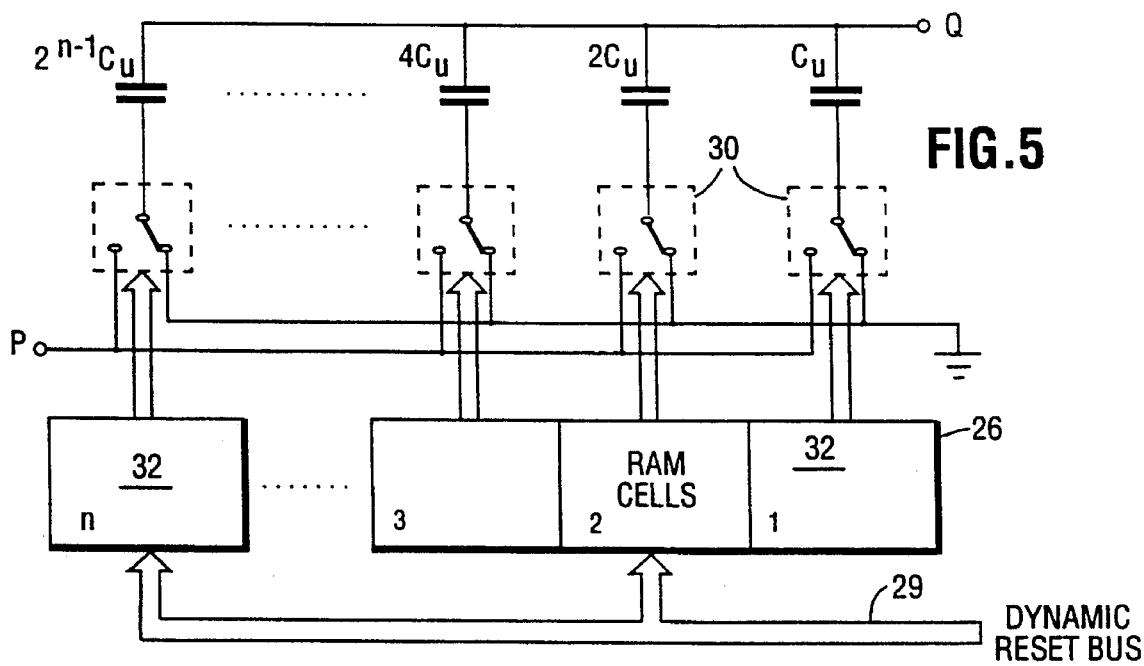
FIG. 5 is a diagram illustrating how the capacitance of the capacitor in a switched capacitor circuit can be varied.

FIG. 4 illustrates the improved circuit wherein the capacitor 1 is programmable. The programmable capacitor can be implemented in any known manner. A particular implementation is illustrated FIG. 5. FIG. 5 illustrates a plurality, n, of capacitors $C_u \ldots 2^{n-1}C_u$ associated with respective switches 30. The RAM 26 comprises a plurality of RAM cells 32 which individually control the state of the respective switches 30. The value of capacitance between the points P and Q thus depends on the number of the parallel capacitors which are connected in the circuit. The RAM can be overwritten by a dynamic reset bus 29.

Figure 6:
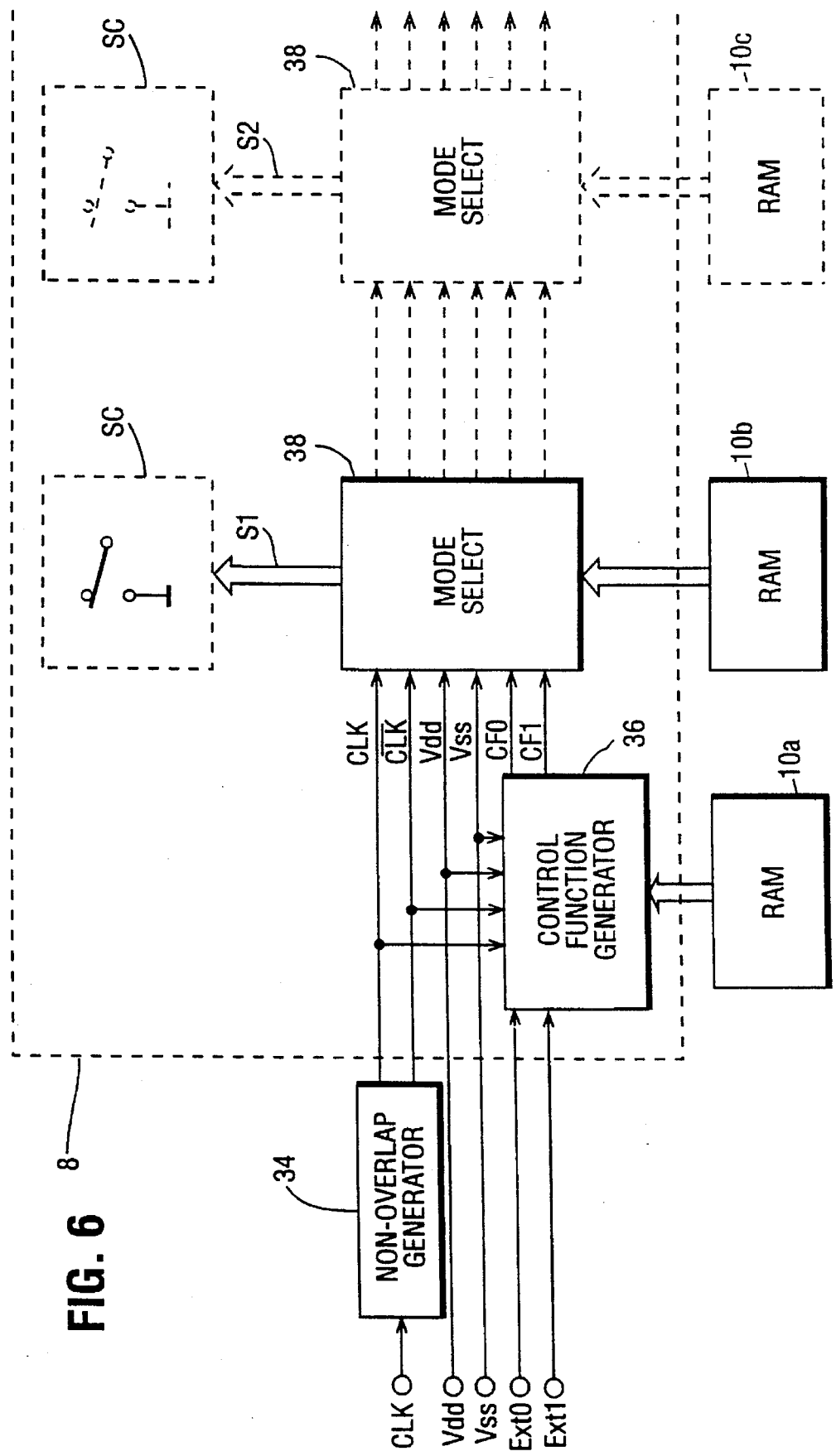
FIG. 6 illustrates in block diagram form an exemplary implementation of the control circuitry and selection circuitry.

FIG. 6 illustrates one implementation of the switch control mechanism 8, defined by a dotted line. FIG. 6 also illustrates a non-overlap generator 34 for providing from a clock signal CLK the non-overlapping clock signal $\overline{CLK}$. FIG. 6 also illustrates in addition to the input signals CLK, $\overline{CLK}$,Vdd,Vss illustrated in FIG. 1, two external control lines Ext0,Ext1 for increasing the versatility of the switch control mechanism 8. Although only two external control lines are shown, more could be provided as necessary. The external control signals Ext0,Ext1 and the input signals CLK, $\overline{CLK}$,Vdd,Vss are fed to a control function generator 36 which is under control of data stored in the RAM 10. In FIG. 6, the RAM 10 is illustrated as having three different RAM sections 10a,10b,10c. The precise arrangement of data storage in the RAM is of course well within the scope of a skilled person.

The control function generator 36 generates from the signals input to it two mode select signals CF0,CF1. Although only two mode select signals are shown, more could be provided as necessary. The mode select signals and the input signals CLK,$\overline{CLK}$,Vdd,Vss are fed to a plurality of mode select circuits 38. There is a mode select circuit associated with each switch circuit SC in the switched capacitor circuit. Thus, in the embodiment of FIG. 4 there will be three mode select circuits provided in the switch control mechanism 8.

Figure 7:
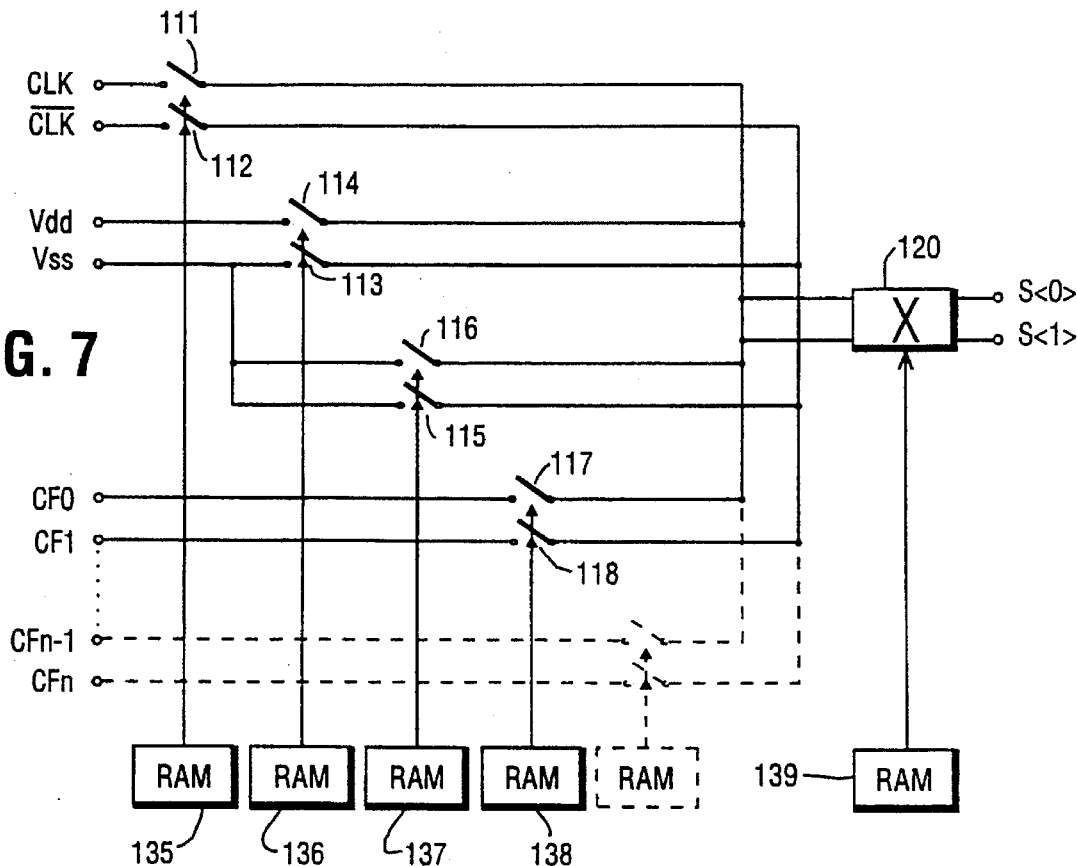
FIG. 7 is a circuit diagram showing one implementation of a mode select circuit of FIG. 6.

FIG. 7 is a circuit diagram of one possible implementation of a mode select circuit 38. The circuit comprises a pair of switches 111,112 associated respectively with the CLK and $\overline{CLK}$ inputs, a pair of switches 114,113 associated respectively with the Vdd and Vss inputs, a pair of switches 116,115 associated with the Vss input and a pair of switches 117,118 associated with the inputs CF0,CF1 respectively. Each of the pairs of switches is controlled by a respective control bit stored in the RAM 10 as denoted by reference numerals 135,136,137 and 138. The mode select circuit includes a change over switch 120 whose state is also controlled by a RAM bit 139. As explained above, each switch circuit receives two control lines S<0>,S<1> which are fed to the control gates 16,18 of the respective pass gates 12,14 in the switch (FIG. 2).

Figure 8:
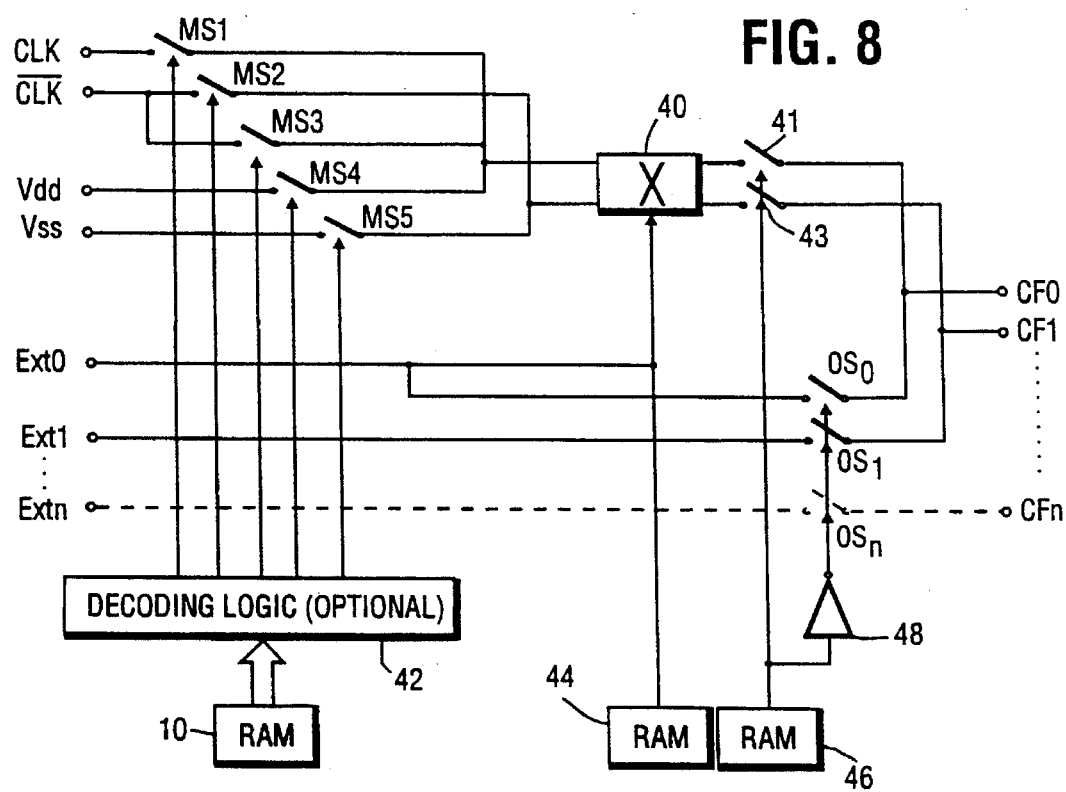
FIG. 8 is a circuit diagram showing one implementation of a control function generator of FIG. 6.

FIG. 8 is a circuit diagram of one implementation of a control function generator 36. In the circuit of FIG. 8 there is a switch MS1 associated with the $\overline{CLK}$ input, switches MS2 and MS3 associated with the CLK input, a switch MS4 associated with the Vdd input and a switch MS5 associated with the Vss input. The outputs of the switches MS1,MS3 and MS4 are fed to one input of a change over switch 40 while the outputs of the switches MS2 and MS5 are fed to another input of the change over switch 40. The outputs of the change over switch 40 are fed via respective output switches 41,43 to supply the signals CF0,CF1. The switches MS1 to MS5 are controlled by output signals from decoding logic circuitry 42 itself controlled by data stored in the RAM 10. The change over switch 40 is also under the control of a RAM bit 44 and the output switches 41,43 are similarly under the control of a RAM bit 46. The control function generator may also optionally receive the inputs Ext0 . . . Extn which are made available via a programming switching means external to the cell (and not shown). These connect to respective output switches OS0,)OS1 . . . OSn which are also under the control of the RAM bit 46 through an inverting gate 48 to the outputs CF0 . . . CFn. The first external control signal Ext0 can overwrite the contents of RAM bit 44 thus controlling the change over switch 40 and implementing a dynamic control function.

Table III illustrates how a two bit code stored in the RAM 10 can be used to set four modes, each mode being defined by five output signals provided to control the switches MS1 to MS5 respectively. It can be seen that five switches MS1 to MS5 must be controlled, but only four different settings are required. The settings are as follows:

Code 00: CLK and $\overline{\text{CLK}}$ are connected to the crossover switch 40 (MS1 and MS2);

Code 01: Vdd and Vss are connected to the crossover switch 40 (MS4 and MS5);

Code 10: $\overline{\text{CLK}}$ and Vss are connected to 40 (switch becomes single pole single throw);

Code 11: $\overline{\text{CLK}}$ and Vss are connected to 40 (switch becomes single pole single throw).

In Table 3 the letters SPST stand for single pole single throw.

Figure 9:
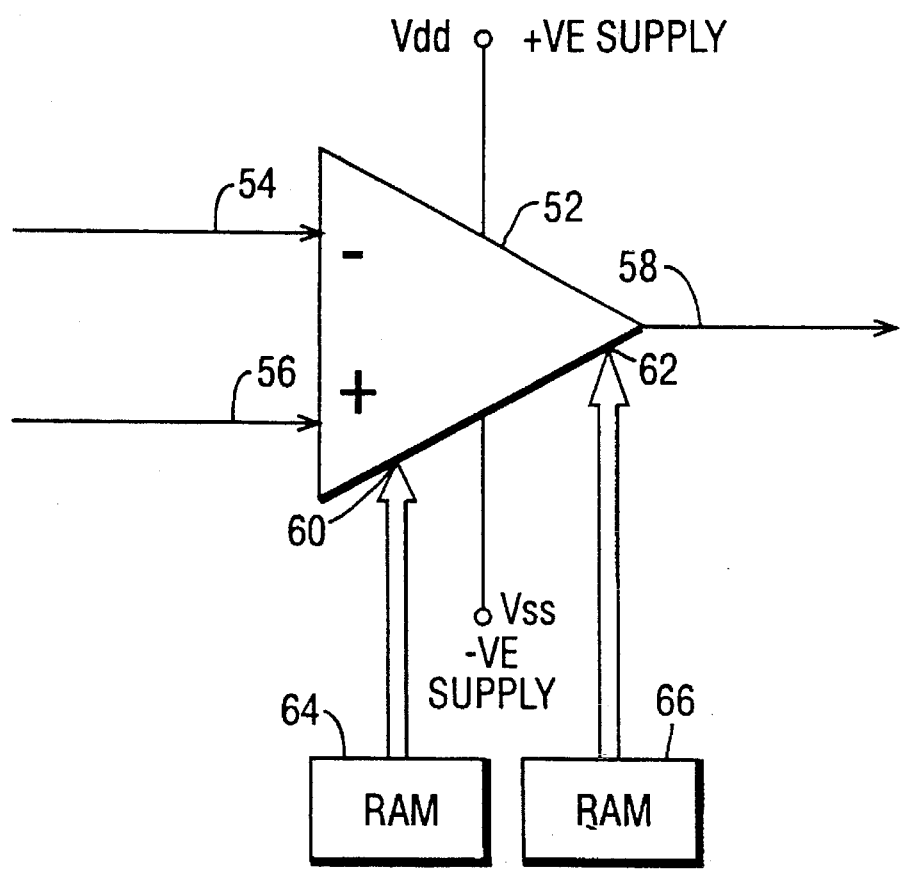
FIG. 9 is a diagram illustrating an operational amplifier with control bits to determine its operational state.

FIG. 9 illustrates an active element implemented as a differential input gain stage 52 which has been modified so that it can receive control bits which enable its function be selected between that of a comparator and that of an operational amplifier. The differential input gain stage 52 has an inverting input 54, a non-inverting input 56 and an output 58. It also has connections to the positive and negative supply rails Vdd,Vss. The differential input gain stage has inputs 60,62 for receiving respective control bits from RAM locations 64,66. RAM location 64 supplies a bit to the input 60 which acts as a bias disable bit to power down the differential input gain stage 52. RAM location 66 supplies to the input 62 an opamp/comparator select bit which determines whether the differential input gain stage will function as an operational amplifier or as a comparator.

Figure 10A:
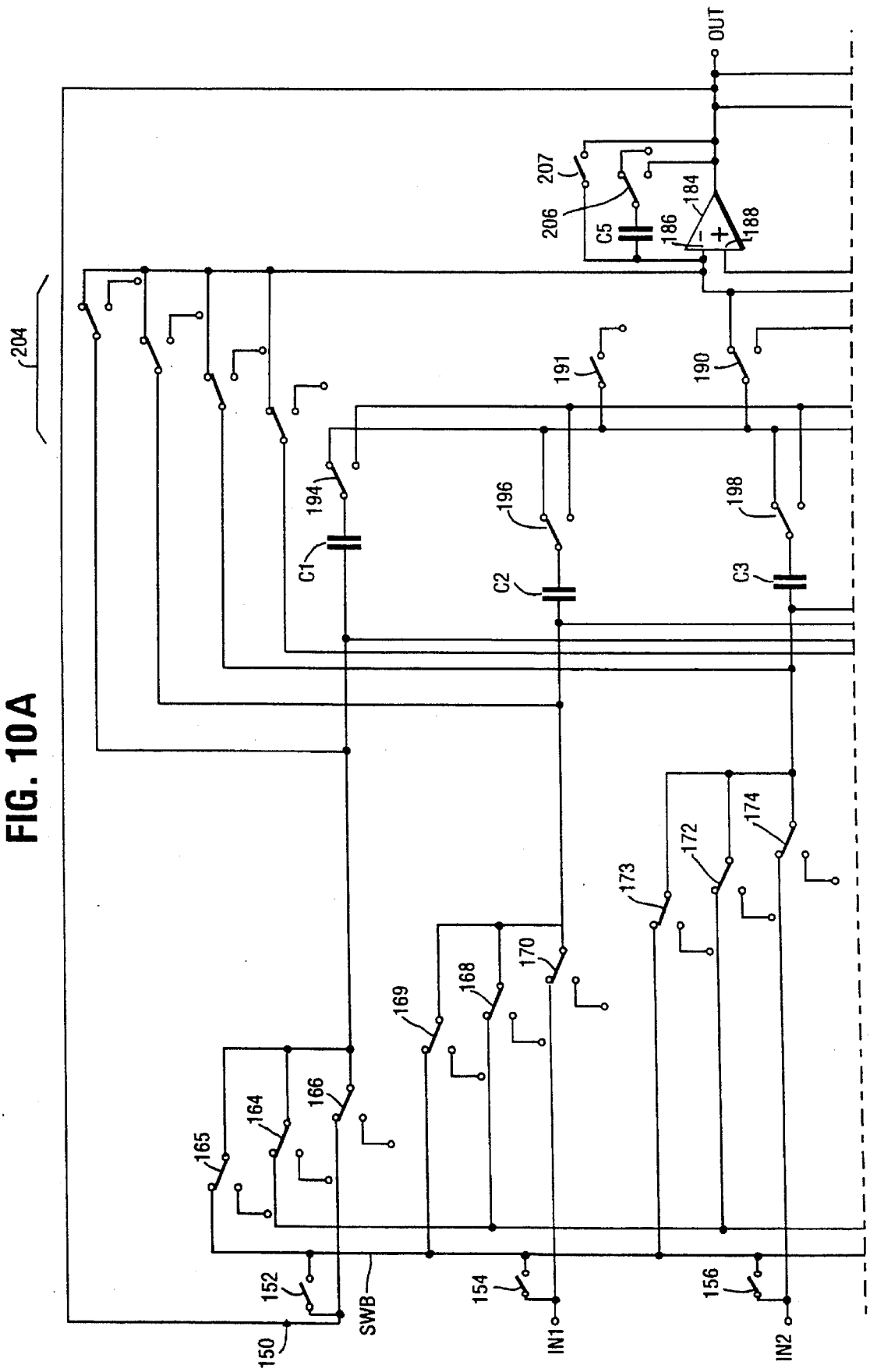
FIGS. 10A and 10B together show a circuit diagram of a programmable analogue cell incorporating switched capacitor circuits and an active element suitable as the basic cell for an array.
Figure 10B:
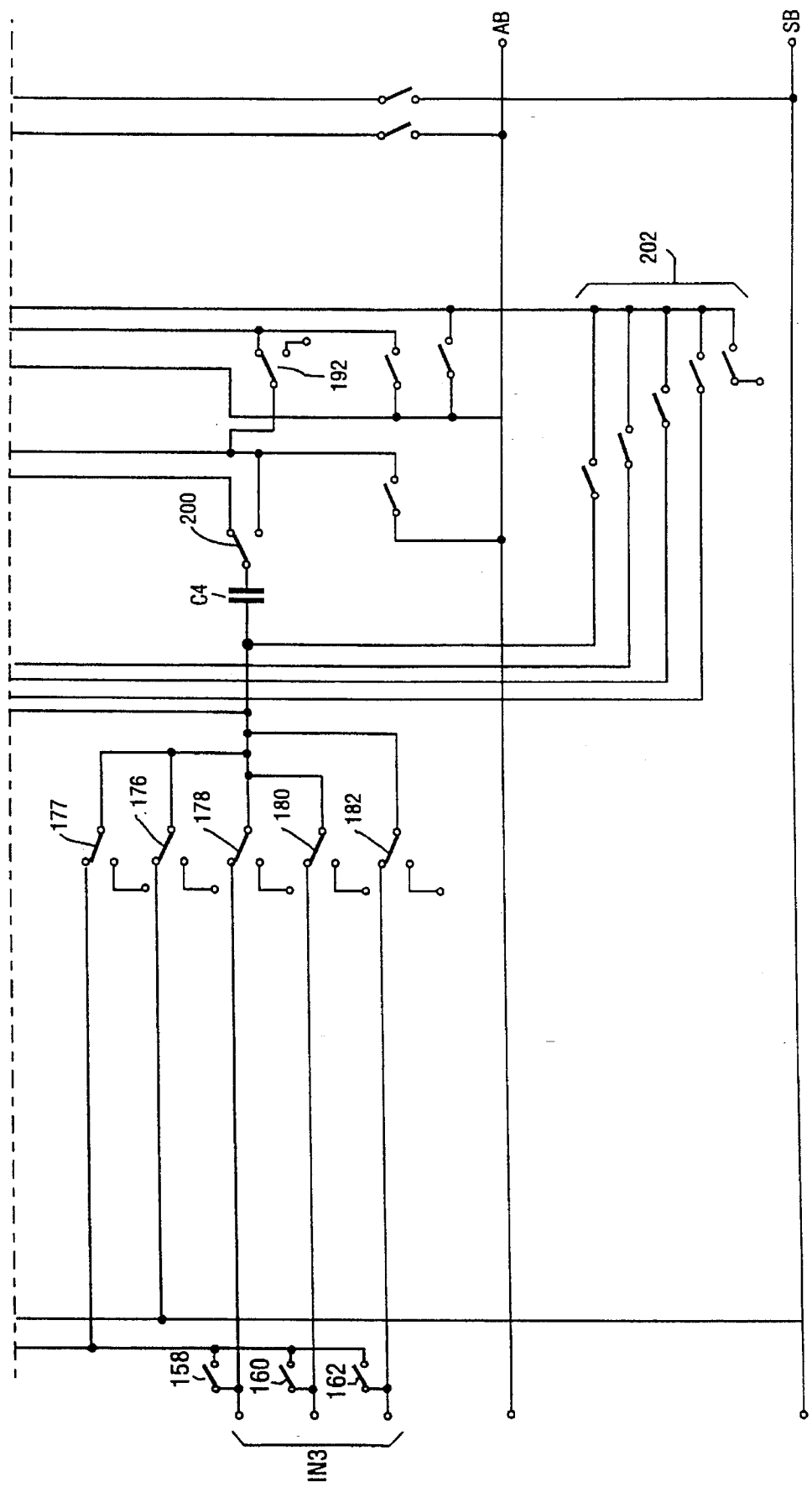

FIG. 10 is a circuit diagram illustrating one embodiment of a programmable analogue cell which can be used in an array of such cells. The cell of FIG. 10 has a plurality of inputs IN1,IN2,IN3. The reference IN3 denotes three inputs which can be selectively switched as described hereinafter. The cell also has an output OUT which is fed back to the input at point 150. The cell is connected to an access bus AB and a signal bus SB. The access bus and the signal bus are made available to all cells in the array via a switching means external to the cell. The cell also has a set of input switches for switching the input signals to the cell onto a single wire bus SWB, thus enabling any input to be connected to any other input. The input switch 152 performs this function for the output signal OUT of the cell. The input switches 154,156 perform this function for the input IN1,IN2 respectively. The input switches 158,160 and 162 perform this function for the respective three inputs denoted generally by IN3. This cell also has a set of input toggle switches which can be controlled by a switch control mechanism in accordance with the invention. They can be controlled both in respect of their mode and also by selectively activating the appropriate switches to control the signals applied to the cell. Toggle switches 165,166,164 select between the single wire bus SWB, the output OUT of the cell and the signal bus SB. Toggle switches 169,170,168 select between the single wire bus SWB, the input IN1 and the signal bus SB. Toggle switches 173,174,172 select between the single wire bus SWB, the input IN2 and the signal bus SB. Toggle switches 177,176,178,180 and 182 select between the single wire bus SWB, the signal bus SB and the respective inputs denoted generally IN3. The signals selected by the appropriate switches in each set 164,165,166; 168,169,170; 172,173, 174; and 176,177,178,180,182 are input to respective capacitors C1,C2,C3,C4. The cell also includes an active element in the form of a differential input gain stage 184 having an inverting input 186 and a non-inverting input 188. Two way fixed position switches connect the capacitors C1,C2,C3,C4 respectively to the inverting input 186 of the OPAMP 184 via either a special function switch 190 or a toggle switch 192. The fixed position two way switches are denoted 194 for capacitor C1, 196 for capacitor C2, 198 for capacitor C3 and 200 for capacitor C4. The toggle switch 192 represents the second switch circuit of the input switched capacitor circuits formed by any of the capacitors C1 . . . C4 and the appropriate one or ones of the toggle switches on the input side 164 . . . 182. The cell also includes a set of on/off switches denoted generally by reference numeral 202 which enable any one of the selected inputs or ground to be connected directly to the non-inverting input 188 of the differential input gain stage 184. The cell also includes a set of toggle switches 204 which perform a similar function, but connecting instead to the inverting input 186 of the differential input gain stage 184. The provision of toggle switches for the switches 204 provides an alternative input summing point for special functions. Reference numeral 206 denotes a toggle switch which is required in a particular implementation of the cell when so-called correlated double-sampling is required. For most standard switched capacitor functions of the cell it is in a fixed position connecting the output of the differential input gain stage 184 to its inverting input 186. via a feedback capacitor C5.

Reference numeral 191 represents a reset switch. Reference numeral 207 denotes a switch connected in feedback across the differential input gain stage 184.

All of the toggle switches in the cell are controllable in the manner described above so that they can operate in a selectable one of different modes as illustrated in Table 1. The cell thus provides a programmable sub-circuit which is ideal for use in an array which includes a plurality of such sub-circuits. In the array, the cells are interconnected under external digital control which enables the function and topology of the switched capacitor circuits to be controlled.

Preferably, the differential input gain stage is as illustrated in FIG. 9 where its primary function of operational amplifier can be altered to optionally form a comparator under the control of digital programming data optionally held in digital storage means, e.g. RAM.

Figure 11:
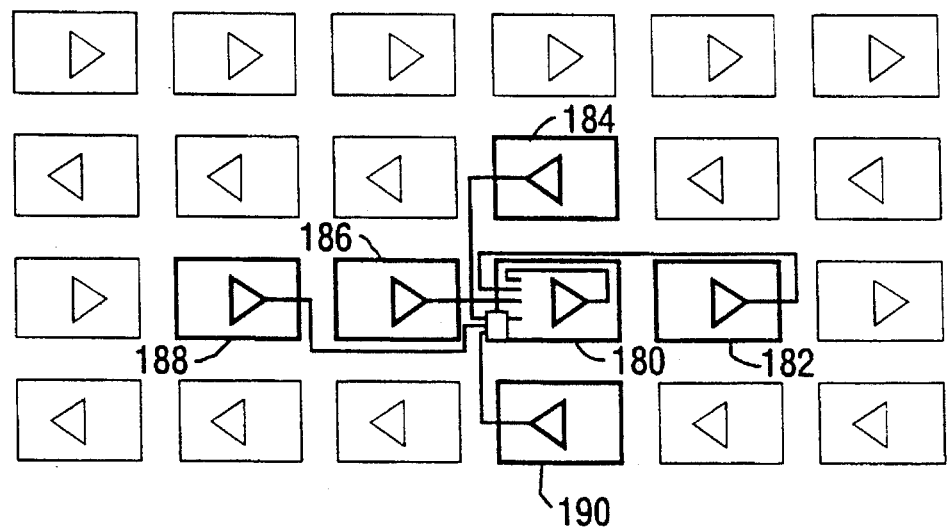
FIG. 11 shows diagrammatically an array with interconnections between cells in the array.

FIG. 11 shows as an example part of an array of such cells illustrating the connections to a basic central cell 180. The cell 180 receives as inputs its own output 150, as IN1 the output from the next adjacent cell in the same row 182, as IN2 the output from the previous adjacent cell in the same row 186, and as IN3 the output from-the last but one cell in the same row 188, and the outputs from the adjacent upper and lower cells 184,190. The output from the central cell 180 will be fed accordingly to four neighbouring cells in the array.

Figure 12A:
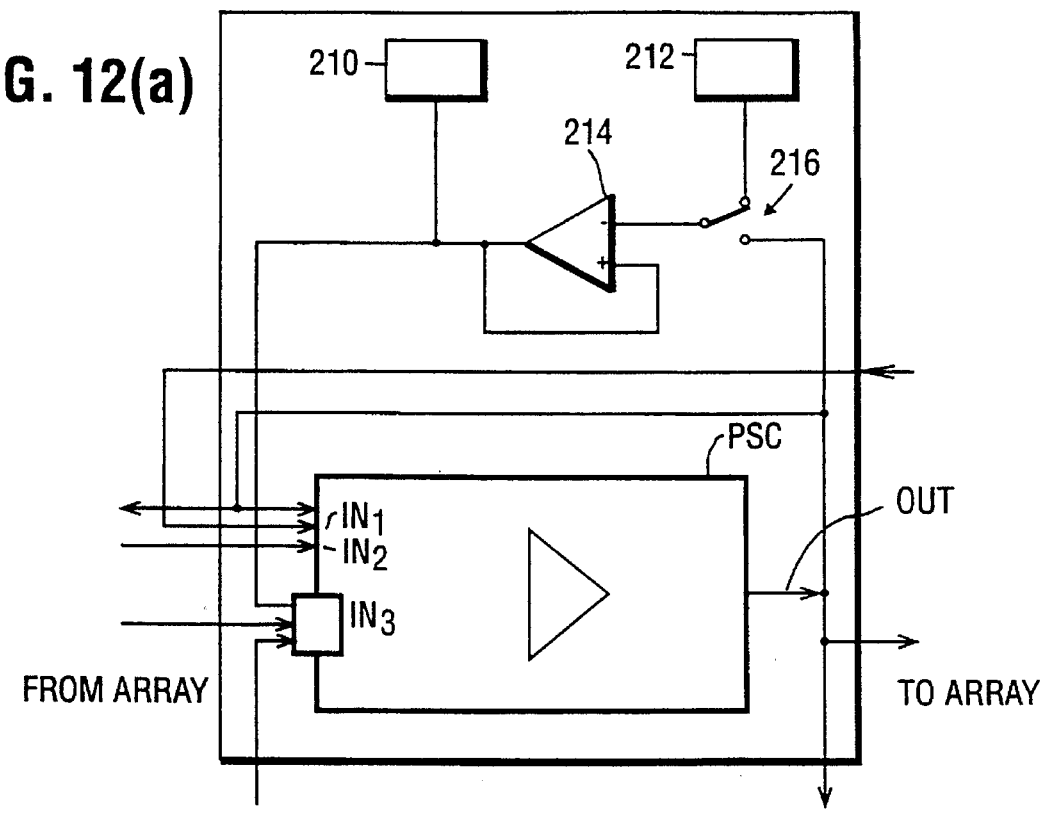
FIGS. 12a and 12b illustrate particular end cells for an array.

FIG. 12a illustrates a cell for an array which is particularly suitable as an analogue voltage input/output cell. The cell includes a programmable sub-circuit which is denoted PSC in FIG. 12a and which is as illustrated in FIG. 10. The cell has one path 210,212 and an additional buffer stage 214. It also has an input/output select switch 216.

Figure 12B:
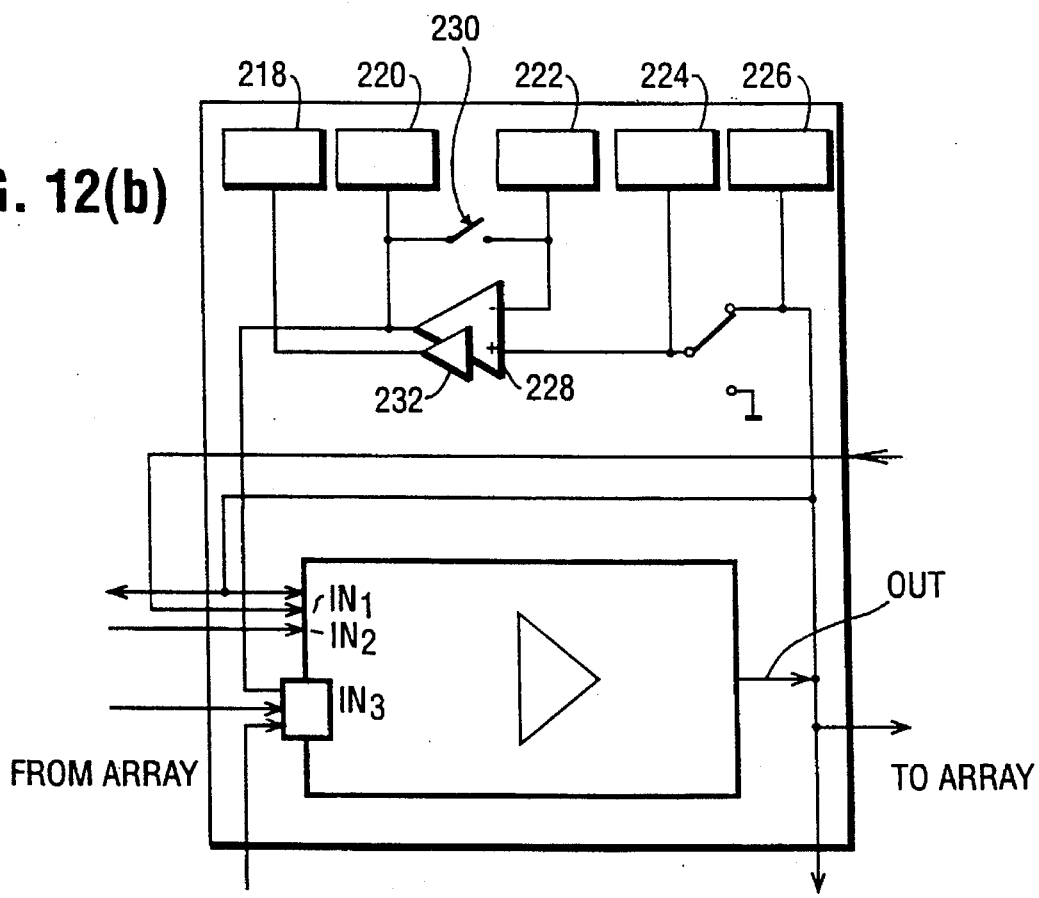

FIG. 12b illustrates a cell for an array which is particularly suitable for general analogue input/output. It comprises a plurality of bond pads 218,220,222,224 and 226 and an additional buffer stage 228. It also has a unity gain buffer switch 230 to allow input or output filtering of various types.

A second identical output stage 232 implemented as a current mirror on the output of the buffer stage enables signal current sourcing from the device if desired.

Figure 13:
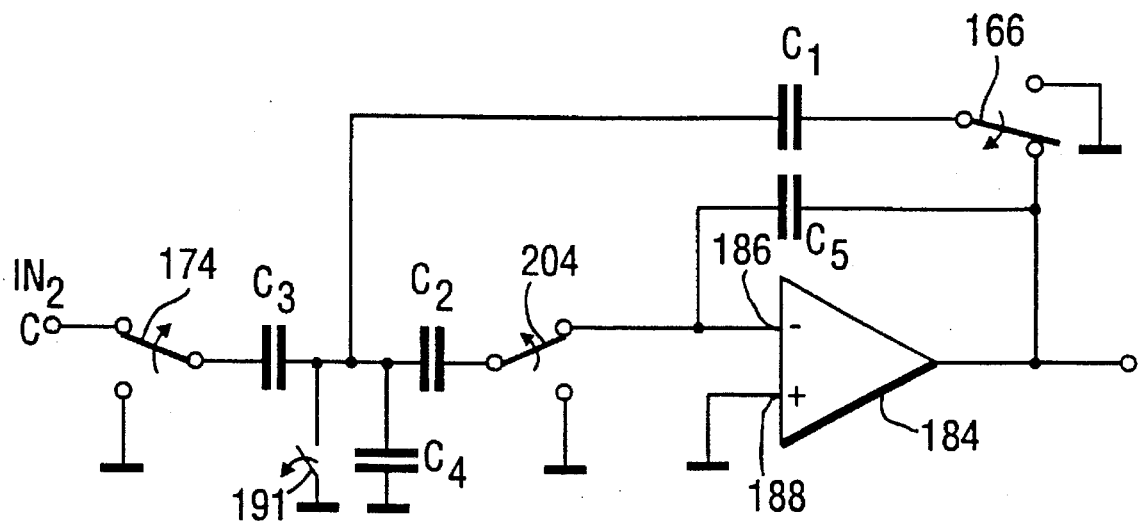
FIGS. 13 and 14 are circuit diagrams of particular circuits that can be implemented using the cell of FIG. 10.

FIG. 13 is a circuit diagram of one possible application of the programmable sub-circuit of FIG. 10. FIG. 13 illustrates a switched capacitor-integrator where a very large time constant is implemented using a charge splitting T-cell technique. The circuit is implemented using as an input IN2 which is routed by a toggle switch 174 to one side of the capacitor C3. The other side of the capacitor C3 is routed via a two way fixed switch 198 through the capacitor C2 via the two way fixed switch 196 and the other side of the capacitor C2 is connected to the inverting input 186 of the operational amplifier 184 via an appropriate one of the toggle switches 204. The output of the operational amplifier 184 is connected through the toggle switch 166 via the capacitor C1 and fixed position switch 194 both through a reset switch 191 to ground and through fixed position switch 178 to ground via capacitor C4.

Figure 14:
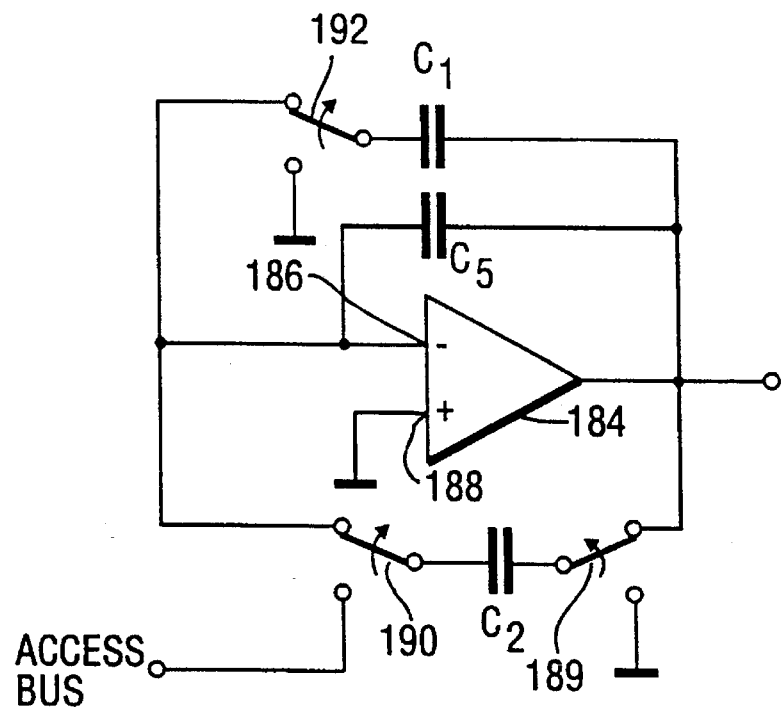

FIG. 14 represents another circuit which can be implemented using the programmable sub-circuit of FIG. 10. This circuit is a single stage inverting sample and hold circuit using the access bus as the input. The access bus is routed via the toggle switch 190 through the capacitor C2 via the two way fixed position switch 196 and to the single wire bus SWB via the toggle switch 169. The input switch 152 then connects the single wire bus SWB to the output of the operational amplifier 184. The output of the operational amplifier is also connected via the toggle switch 166 acting as a routing switch through capacitor C1, to the two way fixed switch 194 and toggle switch 192 to the inverting input 186 of the operational amplifier 184.

Figure 15:
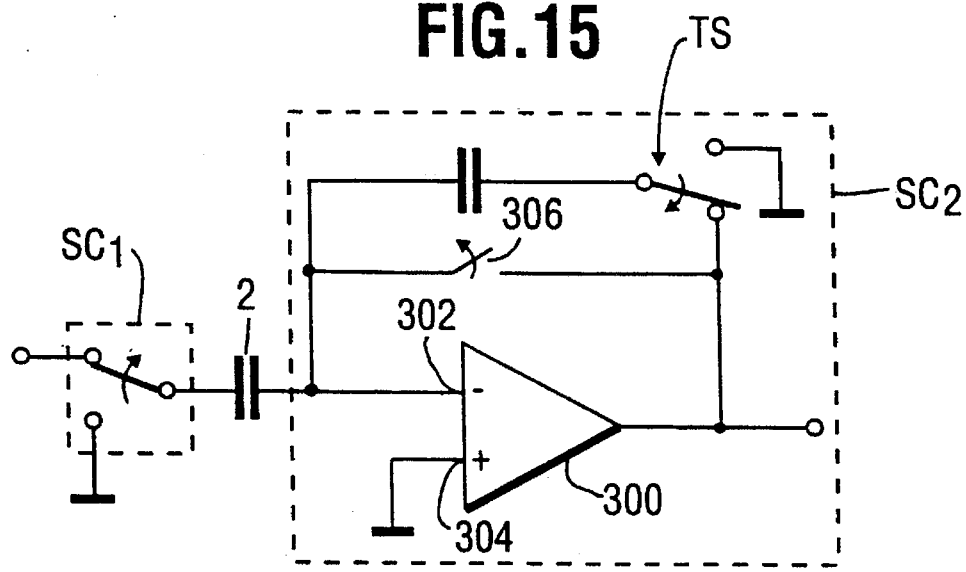
FIG. 15 is a circuit diagram of another embodiment of a switched capacitor circuit incorporating an active element.

In the above description, there has been explained and described how a field programmable analogue cell can be built up using a basic switched capacitor circuit in which each capacitor is associated with first and second switches which are both controllable toggle switches. However, the invention is not restricted to the implementation of switched capacitor circuits wherein each capacitor is connected between first and second toggle switches. The main advantage of the present invention is that the switched capacitor circuit is field programmable, that is that selection circuitry enables a selection to be made between control signals, preferably in accordance with digital configuration data supplied from elsewhere and stored in Random Access Memory cells. The source of the digital configuration data can be on or off chip and this provides the benefit of field programmability and reprogrammability of the switched capacitor circuit. This benefit can also be achieved where different types of switch circuits are envisaged. FIG. 15 shows an implementation where a capacitor 2 has its input terminal connected to a toggle switch SC1 as described above with reference to FIG. 2. However its output is connected to a switch circuit SC2 which incorporates an active element in the form of a differential input gain stage 300. This has an inverting input 302 and a non-inverting input 304, the latter being connected to ground. The inverting input 302 provides a low impedance node capable of receiving sampled charge which is switched through the capacitor 2 by the actions of the toggle switch SC1. A second capacitor and associated toggle switch TS are connected in feedback between the output of the differential input gain stage 300 and the inverting input 302. A single pole single throw switch 306 is also connected between the inverting input 302 and the output of the differential input gain stage 300. Other "active" switch circuits can also be used with the present invention.

It will be readily appreciated that the invention can be implemented with control circuitry and selection circuitry other than that described herein. For example, a set of logic devices could be arranged to receive a periodically varying input such as a clock signal and a set of selection signals (such as configuration bits) and to generate accordingly appropriate control signals. Alternatively, a clock generator could be provided as said control circuitry operable to produce a clock signal having a frequency which varies under the control of a selection signal.

| Switch Representation | Programming function (switch mode) |
|---|---|
| \-A, B (top) | Fix A: connection X-A permanently closed-circuit and X-B permanently open-circuit |
| \-A, B | Fix B: connection X-A permanently open-circuit, and X-B permanently closed-circuit |
| A, B | Toggle on CLK: the connections are toggled such that X-A is closed only when CLK is high and X-B is closed only when $\overline{CLK}$ is high. |
| A, B | Toggle on $\overline{CLK}$: the connections are toggled such that X-A is closed only when $\overline{CLK}$ is high and X-B is closed only when CLK is high. |
| \-A, B | Off: both connections X-A and X-B open circuit |
| A, B, F | External Function: connections X-A and X-B are determined by a special purpose control function. (The two connections must never be closed-circuit simultaneously). |
| \-A, B | Programmable switch: a toggle switch with uncommitted function. These are assumed to have an associated switch controller block. |

TABLE 2

| charge | z-domain evaluation | [$V_{ret}$ = virtual gnd] |
|---|---|---|
| $Q_A$ | $= (V_n - V_{ret}) \cdot C_A$ | $[= V_n \cdot C_A]$ |
| $Q_B$ | $= -(V_n + V_{ref}) \cdot C_B \cdot Z^{-1}$ | $[= -V_n \cdot C_B / Z^{-1}]$ |
| $Q_C$ | $= (V_n - V_{ref}) \cdot C_C \cdot (1 - Z^{-1})$ | $[= V_n \cdot C_c \cdot (1 - Z^{-1})]$ |

TABLE 3

| RAM Code | function | MS1 | MS2 | MS3 | MS4 | MS5 |
|---|---|---|---|---|---|---|
| 00 | clocked | 1 | 1 | 0 | 0 | 0 |
| 01 | fixed position | 0 | 0 | 0 | 1 | 1 |

TABLE 3-continued

| RAM Code | function | MS1 | MS2 | MS3 | MS4 | MS5 |
|---|---|---|---|---|---|---|
| 10 | SPST using $\overline{CLK}$ | 1 | 0 | 0 | 0 | 1 |
| 11 | SPST using $\overline{CLK}$ | 0 | 0 | 1 | 0 | 1 |

What is claimed is:

1. A switched capacitor circuit comprising a capacitor connected in circuitry which includes first and second switch circuits on opposite sides of said capacitor and control circuitry operatively connected to at least one of said first and second switch circuits, said control circuitry being operable to provide one of a plurality of alternative control signals for controlling operation of said at least one switch circuit, one of said alternative control signals being a periodically varying signal to alternate the state of the switch circuit between two alternative states and another of said alternative control signals causing the switch circuit to be held in a fixed state, and selection circuitry to select one of said alternative control signals, said selection circuitry being programmable so that the selection between the alternative control signals can be determined by a user.

2. A switch capacitor circuit according to claim 1 in which said capacitor is connected in series between said first and second switch circuits to provide a parasitic insensitive switched capacitor circuit.

3. A switched capacitor circuit according to claim 2 in which said selection circuitry has a plurality of selection outputs each connected to a respective one of said switch circuits and is operable to connect any one of said alternative control signals to any one of said selection outputs.

4. A switched capacitor circuit according to claim 1 in which said first switch circuit is connected between said capacitor and a first input and is operable in response to the periodically varying signal to connect or disconnect alternately the capacitor to said first input whereby the capacitor may repeatedly sample an input signal at said input, and in the fixed state to connect the capacitor to said first input.

5. A switched capacitor circuit according to claim 4 in which the first switch circuit is operable to connect the capacitor to a ground connection.

6. A switched capacitor circuit according to claim 4 in which the first switch circuit is operable in the fixed state to disconnect the capacitor so that it is no longer in circuit.

7. A switched capacitor circuit according to claim 1 in which said second switch circuit is connected between said capacitor and an output and is operable in response to the periodically varying signal to connect or disconnect alternately the capacitor to said output whereby the output may repeatedly sample a signal held by the capacitor, and in the fixed state to connect the capacitor to the output.

8. A switched capacitor circuit according to claim 7 in which said second switch circuit is operable to connect the capacitor to a ground connection.

9. A switched capacitor circuit according to claim 7 which said second switch circuit is operable in the fixed state to disconnect the capacitor so that it is no longer in circuit.

10. A switched capacitor circuit as claimed in claim 1 in which said control circuitry is arranged to provide two non-overlapping clock signals for controlling operation of said switch circuits.

11. A switched capacitor circuit according to claim 1 in which said control circuitry is arranged to provide a plurality of control signals for controlling said switch circuits, said control signals comprising both periodic signals and aperiodic signals.

12. A switched capacitor circuit according to claim 1 in which said first switch circuit is connected between a plurality of inputs and said capacitor and is operable as a routing switch to connect selectively one of said inputs to said capacitor.

13. A switched capacitor circuit according to claim 1 in which said second switch circuit is connected between a plurality of outputs and said capacitor and is operable as a routing switch to connect selectively one of said outputs to said capacitor.

14. A switched capacitor circuit according to claim 1 in which said capacitor is programmable to vary the capacitance in circuit.

15. A switched capacitor circuit according to claim 14 in which a plurality of selectable capacitance values are stored in a storage device coupled to said capacitor to vary the capacitance in circuit.

16. A switched capacitor circuit according to claim 14 in which a dynamic capacitance adjustment circuit is coupled to said capacitor to vary said capacitance in response to a dynamic input signal.

17. A switched capacitor circuit according to claim 1 which comprises storage circuitry operatively coupled to said selection circuitry for storing a plurality of program selections of outputs to said first and second switch circuits.

18. A switched capacitor circuit according to claim 1 in which said selection circuitry includes a dynamic signal input for receiving a signal to provide at least one of said control signals of the control circuitry in dependence on said dynamic signal input.

19. A switched capacitor circuit according to claim 1 in which said switched capacitor circuit includes additional switch circuits which are coupled to said control circuitry and controlled by said selection circuitry.

20. A switched capacitor circuit according to claim 19 in which there are a plurality of such switch circuits connected to one side of the capacitor, each switch circuit being associated with a respective input, and being controllable as a routing device to connect selectively one of said inputs to said capacitor.

21. A switched capacitor circuit according to claim 19 in which there are a plurality of such switch circuits connected to an output side of said capacitor, each switch circuit being connected to a respective output and being operable as a routing device to connect selectively one of said outputs to said capacitor.

22. A switched capacitor circuit according to claim 1 having an output coupled to an operational amplifier with a feedback circuit providing a virtual ground at said output.

23. A switched capacitor circuit according to claim 22 including a parallel capacitor circuit connected across said operational amplifier.

24. A switched capacitor circuit according to claim 1 in which one of said switch circuits includes an operational amplifier with a capacitive feedback circuit.

25. An array of programmable cells each comprising a switched capacitor circuit connected to an active element, each switched capacitor circuit comprising a capacitor connected in circuitry which includes first and second switch circuits connected on opposite sides of said capacitor, the array including:

control circuitry operatively connected to each of said first and second switch circuits, said control circuitry being operable to provide one of a plurality of alternative control signals to said first and second switch circuits for controlling operation of said first and second switch circuits, one of said alternative control signals being a periodically varying signal to alternate the state of the switch circuits between two alternative states and another of said alternative control signals causing the switch circuit to be held in a fixed state, and selection circuitry operatively connected to said control circuitry to select one of said alternative control signals.

26. An array of programmable switched capacitor circuits in which each switched capacitor circuit comprises a capacitor connected in circuitry which includes first and second switch circuits on opposite sides of said capacitor and control circuitry operatively connected to at least one of said first and second switch circuits, said control circuitry being operable to provide one of a plurality of alternative control signals for controlling operation of said at least one switch circuit, one of said alternative control signals being a periodically varying signal to alternate the state of the switch circuit between two alternative states and another of said alternative control signals causing the switch circuit to be held in a fixed state, and selection circuitry to select one of said alternative control signals, said selection circuitry being programmable so that the selection between the alternative control signals can be determined by a user.

27. A programmable analogue cell comprising an active element having an inverting input, a non-inverting input and an output;

a capacitor connected in feedback between the output of the active element and the inverting input; and a plurality of switched capacitor circuits connected between respective inputs to the cell and the inverting input of the active element each switched capacitor circuit comprising a capacitor connected between first and second switch circuits, wherein each cell has connections for operative connection to control circuitry, said control circuitry being operable to provide one of at least two alternative control signals for controlling operation of said switch circuits at least one of said alternative control signals being a periodically varying signal and another of said alternative control signals causing the switch circuit to be held in a fixed state, and selection circuitry to select one of said alternative control signals.

28. An array of programmable analogue cells, each cell comprising an active element having an inverting input, a non-inverting input and an output;

a capacitor connected in feedback between the output of the active element and the inverting input; and a plurality of switched capacitor circuits connected between respective inputs to the cell and the inverting input of the active element each switched capacitor circuit comprising a capacitor connected between first and second switch circuits, wherein each cell has connections for operative connection to control circuitry, said control circuitry being operable to provide one of at least two alternative control signals for controlling operation of said switch circuits at least one of said alternative control signals being a periodically varying signal and another of said alternative control signals causing the switch circuit to be held in a fixed state, and selection circuitry to select one of said alternative control signals.

29. A method of operating a switched capacitor circuit comprising a capacitor connected in circuitry including first and second switch circuits on opposite sides of said capacitor which method comprises selecting one of a plurality of control signals for determining the state of said first and second switch circuits, said control signals including at least one periodically varying signal and at least one signal for holding the switch circuit in a fixed state.

30. A method of operating a switched capacitor circuit according to claim 29 in which the first and second switch circuits are controlled respectively by first and second non-overlapping clock signals.

31. A method of operating a switched capacitor circuit according to claim 29 in which at least one of said first and second switch circuits is used both as a sampling switch to enable charge stored on the capacitor to be sampled and as a routing switch to allow selective connection of the capacitor to one of a plurality of circuits.

32. A method of operating an array of switched capacitor circuits each connected to a logic circuit, wherein each switched capacitor circuit is operated according to claim 29 and control circuitry of each switched capacitor circuit is programmed to provide selected operation of said first and second switched circuits.

* * * * *